United States Patent
Yoshioka et al.

(10) Patent No.: US 7,427,820 B2
(45) Date of Patent: Sep. 23, 2008

(54) PIEZOELECTRIC/ELECTROSTRICTIVE FILM ELEMENT

(75) Inventors: Kunihiko Yoshioka, Nagoya (JP); Takao Ohnishi, Nagoya (JP); Tomohiro Yamada, Komaki (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 11/960,923

(22) Filed: Dec. 20, 2007

(65) Prior Publication Data

US 2008/0111453 A1    May 15, 2008

Related U.S. Application Data

(63) Continuation of application No. PCT/JP2006/313170, filed on Jun. 26, 2006.

(30) Foreign Application Priority Data

Jun. 29, 2005 (JP) ............................. 2005-189326
Nov. 15, 2005 (JP) ............................. 2005-330589

(51) Int. Cl.
*H01L 41/047* (2006.01)
(52) U.S. Cl. .................. 310/324; 310/365; 310/366; 257/419
(58) Field of Classification Search .............. 310/324, 310/330, 365, 366; 257/414–420
See application file for complete search history.

(56) References Cited

U.S. PATENT DOCUMENTS 6,541,895 B2 * 4/2003 Yamaguchi ................. 310/324
6,586,861 B2 * 7/2003 Misu et al. .................. 310/324
6,705,208 B2 * 3/2004 Lassota ........................ 99/280
7,254,877 B2 * 8/2007 Murai ........................ 29/25.35
7,364,275 B2 * 4/2008 Lim et al. ...................... 347/70

FOREIGN PATENT DOCUMENTS

| JP | 04-268775 | 9/1992 |
|----|-----------|--------|
| JP | 05-267742 | 10/1993 |
| JP | 06-260694 | 9/1994 |
| JP | 08-201265 | 8/1996 |
| JP | 2004-186436 | 7/2004 |

* cited by examiner

*Primary Examiner*—Thomas M Dougherty
(74) *Attorney, Agent, or Firm*—Burr & Brown

(57) ABSTRACT

A lower electrode 4 and an auxiliary electrode 8, a piezoelectric/electrostrictive film 5, and an upper electrode 6 are sequentially arranged in layers on a substrate 1. The lower electrode 4 is continuously formed in a region ranging from a first portion of the thick-walled portion 2 to a thin-walled diaphragm portion 3. The auxiliary electrode 8 is continuously formed in a region ranging from a second portion of the thick-walled portion 2 opposite the first portion to a position on the thin-walled diaphragm portion 3, the position being separated from the lower electrode 4. The upper electrode 6 is formed in such a manner as to overlie the piezoelectric/electrostrictive film 5 and the auxiliary electrode 8. Furthermore, a connection electrode 20 is provided for electrically connecting the upper electrode 6 and the auxiliary electrode 8. Thus, a plurality of paths are provided for electrically connecting the upper electrode 6 and the auxiliary electrode 8. Therefore, even when connection through a certain path is cut off due to fracture of a portion of the upper electrode 6 caused by deterioration in insulating performance of the piezoelectric/electrostrictive film 5, electrical connection between the upper electrode 6 and the auxiliary electrode 8 can be maintained through the remaining path(s).

1 Claim, 3 Drawing Sheets

(i)

(ii)

(iii)

(i)

(ii)

(iii)

PIEZOELECTRIC/ELECTROSTRICTIVE FILM ELEMENT

TECHNICAL FIELD

The present invention relates to a piezoelectric/electrostrictive film element. The piezoelectric/electrostrictive film element of the present invention can be used in, for example, actuators which utilize flexural displacement. Also, the piezoelectric/electrostrictive film element can be used in various sensors (microphones, viscosity sensors, etc.) for detecting, for example, fluid characteristics, sound pressure, very small weight, acceleration, etc.

BACKGROUND ART

Piezoelectric/electrostrictive film elements of this kind have conventionally been used as the above-mentioned actuators and sensors. The conventional configuration of such a piezoelectric/electrostrictive film element has been disclosed in, for example, Japanese Patent Application Laid-Open (kokai) Nos. 5-267742, 6-260694, and 8-201265.

A piezoelectric/electrostrictive film element used as a sensor is disclosed in, for example, Japanese Patent Application Laid-Open (kokai) No. 8-201265. The piezoelectric/electrostrictive film sensor is used to measure fluid characteristics, such as density, concentration, and viscosity. The piezoelectric/electrostrictive film sensor is configured to utilize the interrelation between the amplitude of a piezoelectric/electrostrictive film vibrator and viscous drag of fluid in contact with the vibrator for measuring density, concentration, viscosity, etc. of the fluid.

Specifically, in the piezoelectric/electrostrictive film sensor, when the vibrator is vibrated in the presence of the fluid, the vibrator is subjected to a dynamic resistance caused by viscosity of the fluid. A mechanical vibrating condition of the vibrator can be replaced with an equivalent electrical circuit. On the basis of viscous drag to which the vibrator is subjected, an electrical constant of an equivalent circuit of a piezoelectric/electrostrictive film used to constitute the vibrator varies. By detecting variation of the electrical constant, characteristics, such as viscosity, density, and concentration, of the fluid can be measured.

Fluid whose characteristic can be measured by such a piezoelectric/electrostrictive film sensor encompasses liquid and gas. Examples of liquid which serves as a subject of measurement include, as a matter of course, a single-component liquid formed solely of a main medium selected from among, for example, water, alcohol, oil, etc. Also, the examples of the subject-of-measurement liquid can include a liquid substance (slurry, paste, or the like) formed in such a manner that another medium that is soluble, lightly soluble, or insoluble in such a main medium is added to (dissolved in, mixed with, diffused in, or suspended in) the main medium.

Also, examples of the above-mentioned electrical constant include loss factor, phase, resistance, reactance, conductance, susceptance, inductance, and capacitance. Particularly, phase, or loss factor, which has a single maximal or minimal variation point in the vicinity of the resonance frequency of an equivalent circuit is preferably used. This enables measurement of density and concentration of the fluid in addition to viscosity of the fluid. For example, the concentration of sulfuric acid in an aqueous solution of sulfuric acid can be measured. In addition to the above-mentioned electrical constants, variation of resonance frequency can be used as an index for detecting variation of vibrating condition, so long as no particular problem arises in terms of accuracy of measurement, and durability.

DISCLOSURE OF THE INVENTION

FIG. 3 shows the configuration of a conventional piezoelectric/electrostrictive film element for use in a sensor. In FIG. 3, (i) is a plan view; (ii) is a sectional view taken along line A-A in (i); and (iii) is a sectional view taken along line B-B in (i).

Referring to FIG. 3, in the piezoelectric/electrostrictive film element, a substrate 1 formed from ceramics is configured so as to have a thick-walled portion 2 and a thin-walled diaphragm portion 3. The thick-walled portion 2 is provided around the periphery of the thin-walled diaphragm portion 3. A lower electrode 4, a piezoelectric/electrostrictive film 5, and an upper electrode 6, from bottom to top, are provided in layers on the substrate 1.

An auxiliary electrode 8 is provided on the substrate 1 independently of the lower electrode 4, The auxiliary electrode 8 is formed in such a manner as to partially underlie the piezoelectric/electrostrictive film 5. By virtue of such a configuration, the upper electrode 6 can be formed continuously without involvement of breaking on the auxiliary electrode 8 and on the piezoelectric/electrostrictive film 5, thereby improving reliability of connection of the upper electrode 6.

In such a configuration, a subject fluid of measurement is introduced through through-holes 9 and is accommodated in a cavity portion 10.

In such a piezoelectric/electrostrictive film element, as shown in FIG. 3, the piezoelectric/electrostrictive film 5 is formed in such a manner as to cover the lower electrode 4. The piezoelectric/electrostrictive film 5 is sized so that its peripheral portion projects beyond the lower electrode 4 and overhangs the substrate 1. This eliminates need for accurate positioning between the lower electrode 4 and the piezoelectric/electrostrictive film 5. Therefore, short-circuiting between the lower electrode 4 and the upper electrode 6 can be readily prevented.

Furthermore, in such a piezoelectric/electrostrictive film element, as shown in FIG. 3, overhang portions 11, or peripheral portions, of the piezoelectric/electrostrictive film 5 can be in a state of being incompletely bonded to the substrate 1. That is, there are formed incomplete bond portions 7A where the overhang portions 11 and the substrate 1 are not bonded together.

Herein, an incomplete bond state means a state (partially bonded state) in which the overhang portions 11 and the substrate 1 are partially bonded together, or a state (unbonded state) in which no bonded portion is present between the overhang portions 11 and the substrate 1. Specifically, the peel strength between the substrate 1 and each of the overhang portions 11 is 0.5 kg/mm$^2$ or less.

By virtue of this, a force which effects a flexural displacement of the thin-walled diaphragm portion 3 and is generated by converse piezoelectric effect of the piezoelectric/electrostrictive film 5 is efficiently transmitted to the thin-walled diaphragm portion 3. Therefore, a flexural displacement and vibration of the thin-walled diaphragm portion 3 can be sufficiently developed.

Such an incomplete bond state can be established by appropriately selecting a material for the substrate 1 and a material for the piezoelectric/electrostrictive film 5 such that reactivity between the material for the substrate 1 and the material for the piezoelectric/electrostrictive film 5 is low.

Alternatively, such an incomplete bond state can be established by forming a dummy layer to prevent direct contact between the piezoelectric/electrostrictive film 5 and the substrate 1 at the time of forming the piezoelectric/electrostrictive film 5. Examples of a preferred method for forming the dummy layer include a stamping process, a screen printing process, and an ink jet process.

In the case where the piezoelectric/electrostrictive film 5 and/or the upper electrode 6 are subjected to thermal processing for sintering, the dummy layer can be formed from such a material (e.g., a resin material) that is burned or vanishes in the course of the thermal processing. As a result of the dummy layer vanishing in the thermal processing, the incomplete bond portions 7A are formed.

In the case where the piezoelectric/electrostrictive film 5 and the upper electrode 6 are not subjected to thermal processing, the dummy layer can be formed from a resin material which dissolves in water, an organic solvent, etc. After formation of the piezoelectric/electrostrictive film 5 or after formation of the piezoelectric/electrostrictive film 5 and the upper electrode 6, the dummy layer is dissolvingly eliminated by use of water, an organic solvent, or the like, thereby forming the incomplete bond portions 7A.

Such a piezoelectric/electrostrictive film element is required to provide stable exhibition of characteristics, and improved durability.

For example, for the above-mentioned piezoelectric/electrostrictive film element for use in a sensor which carries out sensing through detection of an electrical characteristic corresponding to a vibrating condition, nonvariation of such an electrical characteristic is desirable. However, in some cases, the conventional piezoelectric/electrostrictive film elements have exhibited variation of an initial electrical constant among element products and time-course variation of an electrical constant.

Particularly, in some cases under severe working conditions, such as high temperature and high humidity, characteristic variation has been significant.

Depending on a material used to form the piezoelectric/electrostrictive film 5, the piezoelectric/electrostrictive film 5 may crack at a position corresponding to an end portion of the thin-walled diaphragm portion 3 at which stress generated in association with vibration or displacement of the thin-walled diaphragm portion 3 is apt to concentrate. Such a crack in the piezoelectric/electrostrictive film 5 may cause breaking of the upper electrode 6, resulting in loss of an expected function of the element.

Furthermore, when the piezoelectric/electrostrictive film 5 is exposed to high temperature and high humidity, the insulating performance of the piezoelectric/electrostrictive film 5 drops. This raises concern about fracture of both of the lower electrode 4 and the upper electrode 6 caused by short circuit therebetween.

The inventors of the present invention carried out extensive studies and as a result found the following.

Conventionally, as shown in FIG. 3, a piezoelectric/electrostrictive film element for use in a sensor which carries out sensing through detection of an electrical characteristic corresponding to a vibrating condition has an incomplete bond portion 7B, which is in an incomplete bond state similar to that of the incomplete bond portions 7A located under the overhang portions 11.

The incomplete bond portion 7B has been formed in such a manner as to overlie the thick-walled portion 2 and the thin-walled diaphragm portion 3 in a region between the lower electrode 4 and the auxiliary electrode 8. Variation of an incomplete bond state of the incomplete bond portion 7B among products and time-course variation of the incomplete bond state have been causes for variation of a vibrating condition and in turn variation of an electrical constant.

In the conventional configuration, the incomplete bond portion 7B, which is weak in mechanical strength and strength of bond with the substrate 1, overlies the thick-walled portion 2, which is stationary, and the thin-walled diaphragm portion 3, which vibrates and is displaced. Thus, for example, at the incomplete bond portion 7B, bonding with the substrate 1 is partially lost, or microcrack arises. Therefore, an incomplete bond state cannot be stably established with good reproducibility. Particularly, when microcrack arises, the microcrack may progress to crack in the piezoelectric/electrostrictive film 5.

In the configuration shown in FIG. 3, the piezoelectric/electrostrictive film 5 sandwiched between the lower electrode 4 and the upper electrode 6 is continuously present over a region ranging from the thin-walled diaphragm portion 3 to the thick-walled portion 2. In this case, an electric field associated with a polarization process or driving is applied to the region ranging from the thin-walled diaphragm portion 3 to the thick-walled portion 2. Therefore, an end portion of the thin-walled diaphragm portion 3, at which stress is apt to concentrate, becomes piezoelectrically active; thus, additional stress arises at the end portion. This may cause generation of a crack.

Furthermore, in use at high temperature, a predetermined capability of the piezoelectric/electrostrictive film 5 may be damaged due to partial loss of polarization of the piezoelectric/electrostrictive film 5.

The present invention has been accomplished in view of the foregoing, and an object of the invention is to stabilize characteristics of a piezoelectric/electrostrictive film element and to improve durability of the element.

A piezoelectric/electrostrictive film element according to the present invention is configured such that a lower electrode and an auxiliary electrode, a piezoelectric/electrostrictive film, and an upper electrode are sequentially arranged in layers on a substrate. The substrate is formed from ceramics and has a thin-walled diaphragm portion and a thick-walled portion. The thick-walled portion is formed around the periphery of the thin-walled portion.

The present invention is characterized in that the piezoelectric/electrostrictive film element is further configured as follows.

In the piezoelectric/electrostrictive film element according to the present invention, the lower electrode is continuously formed in a region ranging from a portion of the thick-walled portion located on one side of the thin-walled diaphragm portion to the thin-walled diaphragm portion. Also, the auxiliary electrode is continuously formed in a region ranging from a position on the thin-walled diaphragm portion, the position being separated from the lower electrode, to a portion of the thick-walled portion located on the other side of the thin-walled diaphragm portion. Furthermore, the piezoelectric/electrostrictive film is formed in such a manner as to overlie the lower electrode and the auxiliary electrode. Also, the upper electrode is electrically connected to the auxiliary electrode through a plurality of mutually independent paths.

Specifically, the lower electrode is continuously formed in a region ranging from a portion of the thick-walled portion located on one side of the thin-walled diaphragm portion to, the thin-walled diaphragm portion. The auxiliary electrode is formed independently of the lower electrode in a region ranging from a portion of the thick-walled portion located on the other side of the thin-walled diaphragm portion to the thin-walled diaphragm portion, wherein the other side is opposite to the one side with respect to the thin-walled diaphragm portion. Also, the piezoelectric/electrostrictive film is formed in such a manner as to overlie the lower electrode and the auxiliary electrode. Furthermore, the upper electrode and the auxiliary electrode are electrically connected to each other through a plurality of mutually independent paths.

In the thus-configured piezoelectric/electrostrictive film element of the present invention, the above-mentioned incomplete bond portion, which could cause variation among products and time-course variation, is not provided in such a manner as to overlie the thin-walled diaphragm portion and the thick-walled portion. This stabilizes element characteristics. Therefore, the piezoelectric/electrostrictive film element is applicable to any working conditions.

Also, in the piezoelectric/electrostrictive film element of the invention, an incomplete bond portion is absent around the periphery of the thin-walled diaphragm portion. By virtue of this, stress can be dispersed around the periphery of the thin-walled diaphragm portion via the lower electrode or the auxiliary electrode. Therefore, occurrence of cracking in the piezoelectric/electrostrictive film can be restrained regardless of the type and characteristic of the piezoelectric/electrostrictive film. Since the range of choice of a piezoelectric/electrostrictive material is widened, various effects are yielded; for example, characteristics can be readily improved, and the degree of freedom of design increases.

In the piezoelectric/electrostrictive film element of the invention, a piezoelectric/electrostrictive active portion is not continuously present in a region ranging from the thin-walled diaphragm portion to the thick-walled portion. The piezoelectric/electrostrictive active portion is a portion of the piezoelectric/electrostrictive film sandwiched between the upper electrode and the lower electrode.

This piezoelectrically deactivates a portion of the piezoelectric/electrostrictive film corresponding to the periphery of the thin-walled diaphragm portion, at which stress is apt to concentrate. Therefore, occurrence of cracking in the portion of the piezoelectric/electrostrictive film can be restrained.

Furthermore, in the piezoelectric/electrostrictive film element of the invention, the upper electrode is electrically connected to the auxiliary electrode through a plurality of mutually independent paths. Therefore, even when connection through a certain path is cut off due to fracture of a portion of the upper electrode caused by deterioration in insulating performance of the piezoelectric/electrostrictive film, electrical connection between the upper electrode and the auxiliary electrode can be maintained through the remaining path(s). Therefore, the piezoelectric/electrostrictive film element can be maintained stably in a usable state.

Notably, the piezoelectric/electrostrictive film element of the invention may be configured such that the piezoelectric/electrostrictive active portion is present only in a region corresponding to the thin-walled portion.

In such a configuration, the piezoelectric/electrostrictive active portion, which is a portion of the piezoelectric/electrostrictive film to which an electric field is applied, is present only above the thin-walled diaphragm portion. Therefore, according to the configuration, an output between the upper electrode and the lower electrode can be obtained more efficiently in response to excitation of the thin-walled diaphragm portion or a vibrating condition of the thin-walled diaphragm portion.

BEST MODE FOR CARRYING OUT THE INVENTION

Figure 1:
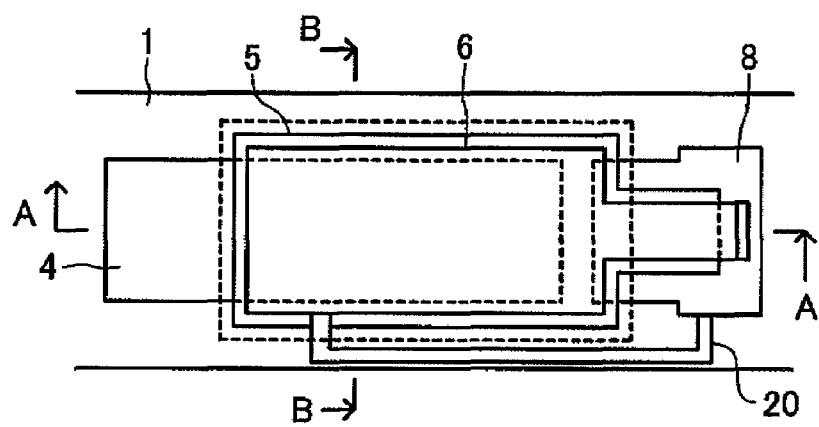
FIG. 1 is a series of views showing the configuration of a piezoelectric/electrostrictive film element for use in a sensor according to an embodiment of the present invention.
Figure 1:
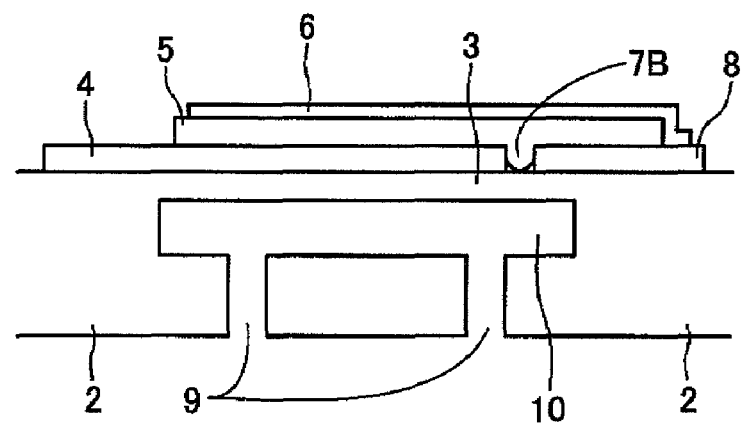
Figure 1:
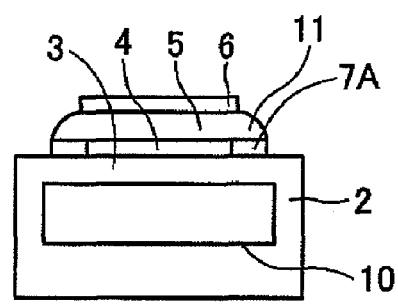
Figure 3:
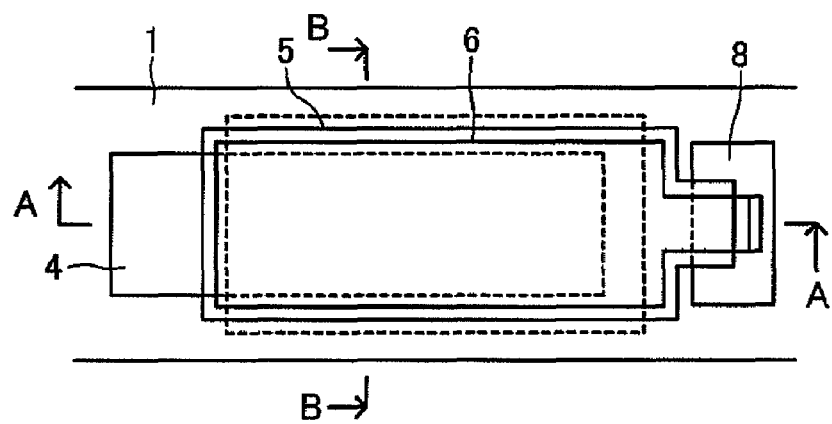
FIG. 3 is a view showing the configuration of a conventional piezoelectric/electrostrictive film element for use in a sensor.
Figure 3:
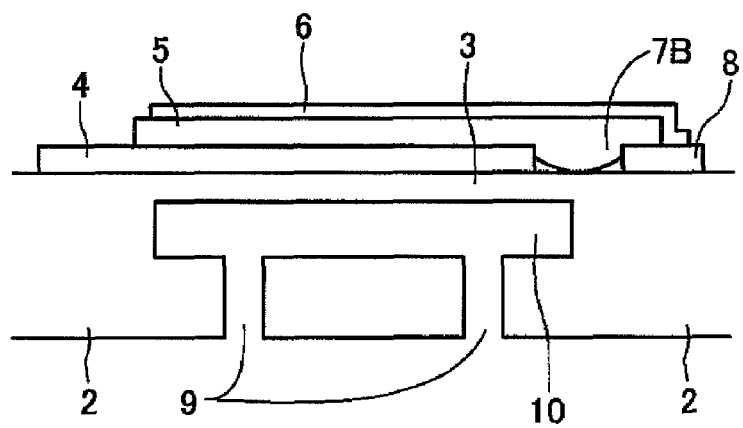
Figure 3:
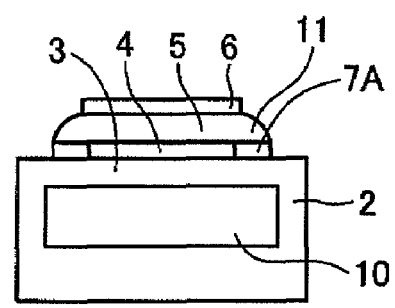

FIG. 1 is a series of views showing the configuration of a piezoelectric/electrostrictive film element for use in a sensor according to an embodiment of the present invention. In FIG. 1, (i) is a plan view, (ii) is a sectional view taken along line A-A of (i), and (iii) is a sectional view taken along line B-B of (i). Components similar to those of the conventional configuration which has been described with reference to FIG. 3 are denoted by like reference numerals in FIG. 1, and the description of the conventional configuration can be applied as appropriate so long as no technical inconsistencies are involved.

<Configuration of Piezoelectric/electrostrictive Film Element for Use in Sensor of Embodiment>

A piezoelectric/electrostrictive film element for use in a sensor of the present embodiment has a ceramic substrate 1. The ceramic substrate 1 has a thick-walled portion 2 and a thin-walled diaphragm portion 3.

A lower electrode 4, a piezoelectric/electrostrictive film 5, and an upper electrode 6 are sequentially formed in layers on the ceramic substrate 1 by an ordinary film formation process. The ceramic substrate 1, the lower electrode 4, the piezoelectric/electrostrictive film 5, and the upper electrode 6 are formed in a one-piece structure. As will be described later, the piezoelectric/electrostrictive film 5 has incomplete bond portions 7A and 7B. Also, an auxiliary electrode 8 is formed on the ceramic substrate 1.

In order to avoid hindering vibration of the piezoelectric/electrostrictive film 5, the thickness of the thin-walled diaphragm portion 3 of the ceramic substrate 1 is 50 μm or less, preferably 30 μm or less, and more preferably 15 μm or less. In a piezoelectric/electrostrictive film element for use in a sensor, a resonance mode to be excited must be simplified. Therefore, in the present embodiment, the planar shape of the thin-walled diaphragm portion 3 is rectangular as shown in FIG. 1(*i*) (refer to the outermost rectangle represented by the broken line). More specifically, a cavity portion 10, which communicates with the exterior of the element through through-holes 9, and the thin-walled diaphragm portion 3, which corresponds to the cavity portion 10, are formed rectangularly as viewed in plane.

The auxiliary electrode 8 is formed on the same plane as the lower electrode 4 independently of the lower electrode 4. That is, the auxiliary electrode 8 is formed at a position apart from an end portion of the lower electrode 4 so as to avoid establishment of electrical communication with the lower electrode 4, which could otherwise result from contact with the lower electrode 4 or disposition in very close proximity of the lower electrode 4. In this manner, a predetermined gap is formed between the lower electrode 4 and the auxiliary electrode 8.

Specifically, the lower electrode 4 and the auxiliary electrode 8 are formed as follows.

The lower electrode 4 is formed in such a manner as to overlie the thick-walled portion 2 and the thin-walled diaphragm portion 3 in a region associated with a first end portion (in FIG. 1(*i*), left end portion) of the thin-walled diaphragm portion 3. That is, a first end portion of the lower electrode 4 located away from the auxiliary electrode 8 is located on a portion of the thick-walled portion 2 which is located externally of the thin-walled diaphragm portion 3. A second end portion (in FIG. 1(i), right end portion) of the lower electrode 4 located in the proximity of the auxiliary electrode 8 is located internally of an end of the thin-walled diaphragm portion 3 (within a region corresponding to the thin-walled diaphragm portion 3). In this manner, the lower electrode 4 is continuously formed along a predetermined length ranging from a first portion (in FIG. 1(i), a left-hand portion) of the thick-walled portion 2 to the thin-walled diaphragm portion 3.

Referring to FIGS. 1(i) and 1(ii), the width (a dimension along a direction perpendicular to the direction of arrangement of the lower electrode 4 and the auxiliary electrode 8 and perpendicular to the direction of thickness of the ceramic substrate 1) of the lower electrode 4 is sufficiently narrower than the width of the thin-walled diaphragm portion 3.

The auxiliary electrode 8 is continuously formed along a predetermined length ranging from a second portion (a portion opposite the lower electrode 4; i.e., in FIG. 1(i), a right-hand portion) of the thick-walled portion 2 to the thin-walled diaphragm portion 3. The auxiliary electrode 8 is provided at such a position as to partially underlie an end portion of the piezoelectric/electrostrictive film 5.

An end portion of the lower electrode 4 and an end portion of the auxiliary electrode 8 which are located on the thick-walled portion 2 are configured so as to serve as lead terminals.

The piezoelectric/electrostrictive film 5 is formed on the lower electrode 4 and on the auxiliary electrode 8. That is, the piezoelectric/electrostrictive film 5 is provided in such a manner as to overlie the lower electrode 4 and the auxiliary electrode 8. In the present embodiment, the piezoelectric/electrostrictive film 5 is formed such that its first end opposite its second end located in the vicinity of the auxiliary electrode 8 is located within a region corresponding to the thin-walled diaphragm portion 3.

Referring to FIGS. 1(i) and 1(iii), the width of the piezoelectric/electrostrictive film 5 is wider than those of the lower electrode 4 and the upper electrode 6 and is narrower than the width of the thin-walled diaphragm portion 3. As shown in FIG. 1(iii), the incomplete bond portions 7A are provided under the corresponding overhang portions 11, which are peripheral portions of the piezoelectric/electrostrictive film 5 projecting laterally beyond the lower electrode 4.

As shown in FIG. 1(ii), the incomplete bond portion 7B is provided on the thin-walled diaphragm portion 3 so as to be proximate only to the thin-walled diaphragm portion 3. Specifically, the incomplete bond portion 7B is provided at a position corresponding only to the thin-walled diaphragm portion 3 (a position which does not correspond to the thick-walled portion 2). The incomplete bond portion 7B is formed in such a manner as to project into the above-mentioned gap at a position which is located on the thin-walled diaphragm portion 3 and is offset from an end portion (a stationary end connected with the thick-walled portion 2) of the thin-walled diaphragm portion 3 toward the center (free end) of the thin-walled diaphragm portion 3.

The upper electrode 6 is provided on the piezoelectric/electrostrictive film 5. The upper electrode 6 is continuously formed in a region ranging from the piezoelectric/electrostrictive film 5 to the auxiliary electrode 8 so as to overlie the piezoelectric/electrostrictive film 5 and the auxiliary electrode 8. That is, the upper electrode 6 electrically communicates with the auxiliary electrode 8.

In the present embodiment, a first end portion of the upper electrode 6 corresponding to the first end portion of the above-mentioned lower electrode 4 is located on the piezoelectric/electrostrictive film 5 in such a manner as to not project beyond the piezoelectric/electrostrictive film 5.

Referring to FIGS. 1(i) and 1(iii), in the present embodiment, the width of the upper electrode 6 is sufficiently narrower than the width of the thin-walled diaphragm portion 3.

That is, in the piezoelectric/electrostrictive film element of the present invention, a piezoelectric/electrostrictive active portion is present only above the thin-walled diaphragm portion 3. The piezoelectric/electrostrictive active portion is a portion of the piezoelectric/electrostrictive film 5 sandwiched between the upper electrode 6 and the lower electrode 4.

Furthermore, a connection electrode 20 is provided so as to electrically connect the upper electrode 6 and the auxiliary electrode 8. That is, the upper electrode 6 and the auxiliary electrode 8 are electrically connected through a plurality of (two in the present embodiment) mutually independent paths.

<Detail of Materials and Manufacturing Method for Configuration of Embodiment>

Preferably, a heat resistant, chemically stable, electrically insulative material is used to form the ceramic substrate 1. As will be described later, this is because a thermal processing may be carried out so as to unite the lower electrode 4, the piezoelectric/electrostrictive film 5, and the upper electrode 6 together into a one-piece structure. Also, this is because, when the piezoelectric/electrostrictive film element is used as a sensor element for sensing liquid characteristics, the liquid may be electrically conductive, or corrosive.

In view of the foregoing, examples of a ceramic material used to form the ceramic substrate 1 include stabilized zirconium oxide, aluminum oxide, magnesium oxide, mullite, aluminum nitride, silicon nitride, and glass. Of these materials, stabilized zirconium oxide can be preferably used, since, even when the thin-walled diaphragm portion 3 is formed thin, it maintains high mechanical strength and exhibits excellent toughness.

The lower electrode 4 and the auxiliary electrode 8 are formed from an electrically conductive material which exhibits good bondability in relation to both of the ceramic substrate 1 and the piezoelectric/electrostrictive film 5. Specifically, a preferred material for the lower electrode 4 and the auxiliary electrode 8 is an electrode material which contains, as a main component, platinum, palladium, rhodium, silver, or an alloy thereof. Particularly, in the case where a thermal processing for sintering is carried out in formation of the piezoelectric/electrostrictive film 5, platinum or an alloy which contains platinum as a main component is preferably used. Notably, different materials or the same material may be used to form the lower electrode 4 and the auxiliary electrode 8.

Any one of known various film formation processes is used to form the lower electrode 4 and the auxiliary electrode 8. A method of forming the lower electrode 4 and the auxiliary electrode 8 can be selected as appropriate from thin-film formation processes, such as ion beam process, sputtering, vacuum deposition, CVD, ion plating, and plating, and thick-film formation processes, such as screen printing, spraying, and dipping. Of these processes, particularly, a sputtering process and a screen printing process are preferably used.

After being formed by a film formation process, the lower electrode 4 and the auxiliary electrode 8 are subjected to a thermal processing as needed so as to be bonded to the ceramic substrate 1 and to the piezoelectric/electrostrictive film 5, thereby forming a one-piece structure (such a thermal processing is not necessarily required).

No particular limitation is imposed on a material for the piezoelectric/electrostrictive film 5, so long as the material exhibits the piezoelectric/electrostrictive effect. Examples of such a material include lead-based ceramic piezoelectric/electrostrictive materials, such as lead zirconate, lead titanate, and lead zirconate titanate (PZT); barium titanate, and barium titanate ceramic ferroelectrics which contain barium titanate as a main component; polymeric piezoelectrics as typified by polyvinylidene fluoride (PVDF); and Bi ceramic piezoelectrics as typified by $(Bi_{0.5}Na_{0.5})TiO_3$, and Bi layer-structured ceramic.

Needless to say, mixtures of the above materials having improved piezoelectric/electrostrictive characteristic, solid solutions of the above materials having improved piezoelectric/electrostrictive characteristic, and the above materials to which an additive(s) is added for improving piezoelectric/electrostrictive characteristic can also be used. PZT piezoelectrics exhibit high piezoelectric characteristic and thus are preferably used to form sensors which can perform high-sensitivity detection. In the present invention, preferably, the piezoelectric/electrostrictive film 5 is formed from a material which contains, as a main component, at least one of lead titanate, lead zirconate, magnesium lead niobate, and nickel lead niobate. This is because their reactivity in relation to a material used to form the ceramic substrate 1 is low. Also, this is because: since segregation of components is unlikely to occur during a thermal processing and since processing for maintaining composition can be favorably carried out, a desired composition and a desired crystal structure can be readily attained.

In the case where platinum or an alloy which contains platinum as a main component is used to form the lower electrode 4 and the auxiliary electrode 8, $(Bi_{0.5}Na_{0.5})TiO_3$ or a material which contains $(Bi_{0.5}Na_{0.5})TiO_3$ as a main component is preferably used to form the piezoelectric/electrostrictive film 5, since such a material exhibits higher bondability in relation to platinum and the alloy; lowers variation of characteristics among elements; and provides high reliability. Of these materials, particularly, $(1-x)(Bi_{0.5}Na_{0.5})TiO_3$-$xKNbO_3$ (x is mol fraction; $0 \leq x \leq 0.06$) or a material which contains $(1-x)(Bi_{0.5}Na_{0.5})TiO_3$-$xKNbO_3$ as a main component is more preferably used, since such a material has relatively high piezoelectric characteristic.

The piezoelectric/electrostrictive film 5 is formed from such a piezoelectric/electrostrictive material by any one of known various film formation processes similar to those used to form the lower electrode 4 and the auxiliary electrode 8. Of these processes, screen printing is preferably used, since it is of low cost.

A material for the upper electrode 6 can be an electrically conductive material having high bondability in relation to the piezoelectric/electrostrictive film 5. The upper electrode 6 is also formed by any one of film formation processes similar to those used to form the lower electrode 4 and the auxiliary electrode 8. After being formed by a film formation process, the upper electrode 6 is subjected to a thermal processing as needed so as to be bonded to the piezoelectric/electrostrictive film 5 and to the auxiliary electrode 8, thereby forming a one-piece structure. Such a thermal processing is not necessarily required as in the case of the lower electrode 4.

In the case where the lower electrode 4, the piezoelectric/electrostrictive film 5, and the upper electrode 6 are bonded together by a thermal processing, the thermal processing may be performed when each of the lower electrode 4, the piezoelectric/electrostrictive film 5, and the upper electrode 6 is formed. Alternatively, after the lower electrode 4, the piezoelectric/electrostrictive film 5, and the upper electrode 6 are formed by respective film formation processes, they may be subjected to a simultaneous thermal processing. Needless to say, when a thermal processing is performed, a proper thermal processing temperature is employed in order to attain good bondability and to restrain degeneration, which could otherwise result from diffusion of component elements.

<Another Embodiment>

Figure 2:
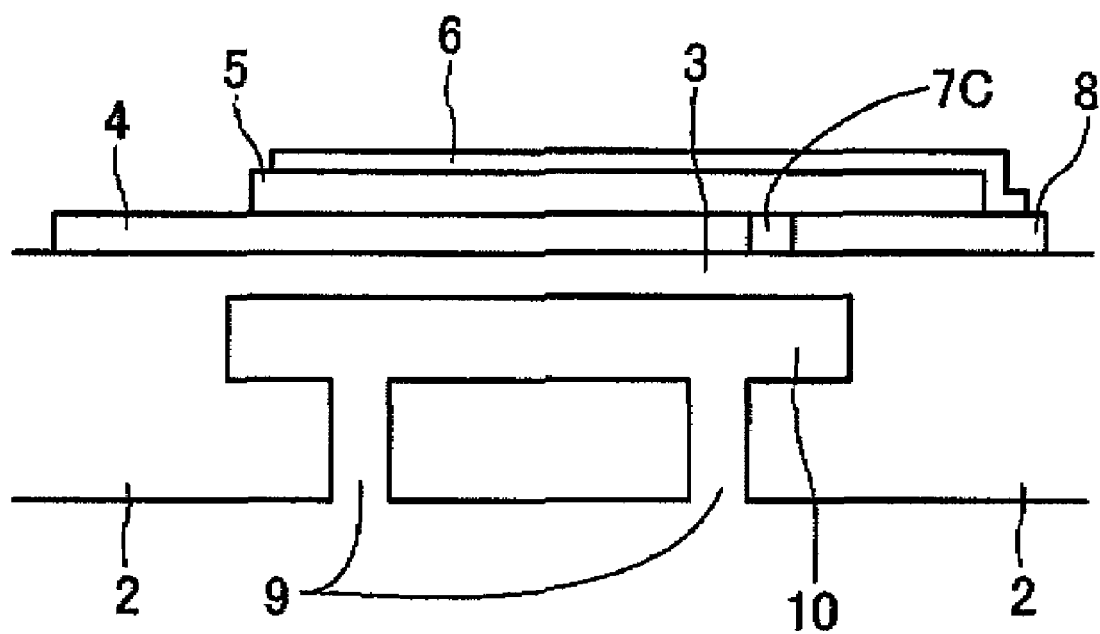
FIG. 2 is a side sectional view showing the configuration of a piezoelectric/electrostrictive film element for use in a sensor according to another embodiment of the present invention.

As shown in FIG. 2, a bond layer 7C for bonding the piezoelectric/electrostrictive film 5 and the thin-walled diaphragm portion 3 can be formed between the lower electrode 4 and the auxiliary electrode 8. In this case, before the piezoelectric/electrostrictive film 5 is formed, the bond layer 7C is formed as shown in FIG. 2 at a position corresponding to the incomplete bond portion 7B in FIG. 1. The bond layer 7C is formed from an insulant.

A material used to form the bond layer 7C may be either organic or inorganic, so long as the material exhibits high adherence and bondability in relation to both of the piezoelectric/electrostrictive film 5 and the ceramic substrate 1. More preferably, in view of attainment of bondability with high reliability, the thermal expansion coefficient of a material used to form the bond layer 7C assumes an intermediate value between the thermal expansion coefficient of a material used to form the ceramic substrate 1 and the thermal expansion coefficient of a material used to form the piezoelectric/electrostrictive film 5.

In the case where the piezoelectric/electrostrictive film 5 is subjected to a thermal processing for sintering, a glass material can be preferably used to form the bond layer 7C. This is because a glass material exhibits high adherence and bondability in relation to both of the piezoelectric/electrostrictive film 5 and the ceramic substrate 1. Particularly, a glass material having a softening point equal to or higher than a thermal processing temperature for the piezoelectric/electrostrictive film 5 is more preferably used. This is because the piezoelectric/electrostrictive film 5 and the ceramic substrate 1 can be bonded more strongly. Also, this is because a high softening point can restrain deformation in the course of the thermal processing.

Furthermore, in the case where the piezoelectric/electrostrictive film 5 is formed from $(Bi_{0.5}Na_{0.5})TiO_3$ or a material which contains $(Bi_{0.5}Na_{0.5})TiO_3$ as a main component, or is formed from $(1-x)(Bi_{0.5}Na_{0.5})TiO_3$-$xKNbO_3$ (x is mol fraction; $0 \leq x \leq 0.06$) or a material which contains $(1-x)(Bi_{0.5}Na_{0.5})TiO_3$-$xKNbO_3$ as a main component, the bond layer 7C formed from a material which contains $(1-x)(Bi_{0.5}Na_{0.5})TiO_3$-$xKNbO_3$ (x is mol fraction; $0.08 \leq x \leq 0.5$) as a main component is more preferably used. This is because adherence in relation to both of the piezoelectric/electrostrictive film 5 and the ceramic substrate 1 is high. Also, this is because there can be restrained adverse effect on the piezoelectric/electrostrictive film 5 and on the ceramic substrate 1 in the course of a thermal processing.

As a result of $(1-x)(Bi_{0.5}Na_{0.5})TiO_3$-$xKNbO_3$ (x is mol fraction; $0.08 \leq x \leq 0.5$) being used to form the bond layer 7C, the bond layer 7C contains components similar to those of the piezoelectric/electrostrictive film 5. This enhances adherence between the piezoelectric/electrostrictive film 5 and the bond layer 7C. This lowers susceptibility to a problem caused by diffusion of foreign elements which is apt to arise when glass is used to form the bond layer 7C.

Furthermore, since the material used to form the bond layer 7C contains a large amount of $KNbO_3$, reactivity in relation to the ceramic substrate 1 enhances, so that the bond layer 7C can be strongly bonded to the ceramic substrate 1.

Additionally, $(1-x)(Bi_{0.5}Na_{0.5})TiO_3$-$xKNbO_3$ (x is mol fraction; $0.08 \leqq x \leqq 0.5$) exhibits little piezoelectric characteristic. Accordingly, an electric field which is generated between the lower electrode 4 and the auxiliary electrode 8 in use does not cause generation of vibration, displacement, and stress in the bond layer 7C.

An ordinary thick-film formation process can be used to form the bond layer 7C. Particularly, a stamping process or a screen printing process can be preferably used. In the case where a portion to be formed has a size of several tens µm to several hundreds µm, an ink jet processing can be preferably used.

In the case where a thermal processing is required in formation of the bond layer 7C, the thermal processing may be carried out before the next step of forming the piezoelectric/electrostrictive film 5. Alternatively, after the piezoelectric/electrostrictive film 5 is formed, the bond layer 7C and the piezoelectric/electrostrictive film 5 may simultaneously undergo a thermal processing.

The piezoelectric/electrostrictive film 5 is formed in such a manner as to overlie the lower electrode 4, the auxiliary electrode 8, and the bond layer 7C, and has such a size as to cover the lower electrode 4.

The formed piezoelectric/electrostrictive film 5 is subjected to a thermal processing as needed, thereby being united with the lower electrode 4, the auxiliary electrode 8, and the bond layer 7C. In the case where, in order to restrain variation of characteristics among elements and to enhance reliability, bondability of the piezoelectric/electrostrictive film 5 in relation to the lower electrode 4, the auxiliary electrode 8, and the bond layer 7C must be more strengthened, preferably, $(Bi_{0.5}Na_{0.5})TiO_3$ or a material which contains $(Bi_{0.5}Na_{0.5})TiO_3$ as a main component (particularly, $(1-x)(Bi_{0.5}Na_{0.5})TiO_3$-$xKNbO_3$ (x is mol fraction; $0 \leqq x \leqq 0.06$) or a material which contains $(1-x)(Bi_{0.5}Na_{0.5})TiO_3$-$xKNbO_3$ as a main component) is used to form the piezoelectric/electrostrictive film 5, and the formed piezoelectric/electrostrictive film 5 is subjected to a thermal processing at a temperature of 900° C. to 1,400° C., preferably 1,000° C. to 1,300° C. The same convention is applied to the case where a PZT material is used. In this case, in order to prevent the piezoelectric/electrostrictive film 5 from becoming unstable at high temperature, preferably, the thermal processing is carried out while controlling atmosphere as well as a piezoelectric/electrostrictive material evaporation source.

Notably, by applying pulse voltage to the element (specifically, the piezoelectric/electrostrictive film 5) a plurality of times for polarization, polarizability can be improved in a short time. In this case, we have found that, by applying pulse voltage in such a manner that the pulse voltage increases with the number of applications, polarizability can be improved in a shorter time. Conceivably, this is because polarization progresses while stress present in the piezoelectric/electrostrictive film 5 is being mitigated.

Furthermore, after the above-mentioned polarization process, heat (100° C.) was applied to the piezoelectric/electrostrictive film element so as to converge the values of electrical constants (capacitance, loss factor, etc.) of the piezoelectric/electrostrictive film 5; subsequently (upon convergence of the electrical constants), the piezoelectric/electrostrictive film 5 was subjected to a re-polarization process. This revealed that such a process could reliably impart a predetermined capability to the piezoelectric/electrostrictive film 5. Also, by means of carrying out the re-polarization process through a single application of pulse voltage, the characteristics of the piezoelectric/electrostrictive film element were able to be stabilized. Notably, resistance, reactance, conductance, susceptance, inductance, etc. of the piezoelectric/electrostrictive film 5 can also be used, as appropriate, as the above-mentioned electrical constants.

<Operation/Effect of Configuration of Embodiment>

As described above, in the piezoelectric/electrostrictive film element of the embodiment, the above-mentioned incomplete bond portion 7B, which could cause variation among products and time-course variation, is not provided in such a manner as to overlie the thin-walled diaphragm portion 3 and the thick-walled portion 2. This stabilizes element characteristics. Therefore, the piezoelectric/electrostrictive film element is applicable to any working conditions.

Also, in the piezoelectric/electrostrictive film element of the embodiment, the incomplete bond portions 7A and 7B are absent around the periphery of the thin-walled diaphragm portion 3. By virtue of this, stress can be dispersed around the periphery of the thin-walled diaphragm portion 3 via the lower electrode 4 or the auxiliary electrode 8. Therefore, occurrence of cracking in the piezoelectric/electrostrictive film 5 can be restrained regardless of the type and characteristic of the piezoelectric/electrostrictive film 5. Since the range of choice of a piezoelectric/electrostrictive material used to form the piezoelectric/electrostrictive film 5 is widened, various effects are yielded; for example, characteristics can be readily improved, and the degree of freedom of design increases.

In the piezoelectric/electrostrictive film element of the embodiment, a piezoelectric/electrostrictive active portion is present only above the thin-walled diaphragm portion 3. Therefore, according to the configuration, an output between the upper electrode 6 and the lower electrode 4 can be obtained more efficiently in response to excitation of the thin-walled diaphragm portion 3 or a vibrating condition of the thin-walled diaphragm portion 3.

In the piezoelectric/electrostrictive film element of the embodiment, a piezoelectric/electrostrictive active portion is not continuously present in a region ranging from the thin-walled diaphragm portion 3 to the thick-walled portion 2. This piezoelectrically deactivates a portion of the piezoelectric/electrostrictive film 5 corresponding to the periphery of the thin-walled diaphragm portion 3, at which stress is apt to concentrate. Therefore, occurrence of cracking in the portion of the piezoelectric/electrostrictive film 5 can be restrained.

Furthermore, in the piezoelectric/electrostrictive film element of the embodiment, the upper electrode 6 is electrically connected to the auxiliary electrode 8 through a plurality of mutually independent paths. Therefore, even when connection through a certain path is cut off due to fracture of a portion of the upper electrode 6 caused by deterioration in insulating performance of the piezoelectric/electrostrictive film 5, electrical connection between the upper electrode 6 and the auxiliary electrode 8 can be maintained through the remaining path (the connection electrode 20). Therefore, the piezoelectric/electrostrictive film element can be maintained stably in a usable state.

EXAMPLE MODIFICATIONS

The above-described embodiments are mere examples of the best mode which the applicant of the present invention contemplated at the time of filing the present application. The present invention is not limited to the above-described embodiments. Various modifications to the above-described embodiments are possible, so long as the invention is not modified in essence.

Modifications to the above-described embodiments will next be exemplified. Needless to say, even modifications are not limited to those exemplified below. Limitingly construing the present invention based on the above embodiments and the following modifications (particularly, limitingly construing those operationally and functionally expressed elements which partially constitute the means for solving the problems to be solved by the present invention, based on the description of the above embodiments and the following modifications) impairs the interests of a patent applicant while unfairly benefiting imitators; is adverse to the purpose of the Patent Law of protecting and utilizing an invention; and is thus impermissible. Needless to say, the following modifications can be combined as appropriate so long as no technical inconsistencies are involved.

(1) Applications of the present invention are not limited to sensor elements, such as those of the above embodiments. For example, the present invention can be applied to actuators.

(2) The planar shape of the thin-walled diaphragm portion 3 can be any shape, such as a true circular-shape, a square shape, a rectangular shape, and an elliptical shape, in addition to a rectangular shape. In view of the requirement that, in a piezoelectric/electrostrictive film element for use in a sensor, a resonance mode to be excited be simplified, a rectangular shape and a true circular shape can be particularly preferably used.

(3) The configuration of the connection electrode 20 is also not limited to the above embodiments. For example, a plurality of connection electrodes 20 may be formed.

Also, an end of the connection electrode 20 located on the side toward the upper electrode 6 may be connected to any position of the upper electrode 6.

Particularly, a preferred configuration of the connection electrode 20 is as shown in FIG. 1(*i*); i.e., the end of the connection electrode 20 located on the side toward the upper electrode 6 is connected to the upper electrode 6 at a position distant from the auxiliary electrode 8 so as to provide two electrical communication paths between the upper electrode 6 and the auxiliary electrode 8 such that the two paths are relatively apart from each other. This is because, when a portion of the upper electrode 6 is fractured due to deterioration in insulating performance of the piezoelectric/electrostrictive film 5, the possibility that connection through at least one of the two paths is established is enhanced.

Furthermore, the end of the connection electrode 20 located on the side toward the upper electrode 6 may branch into a plurality of ends, thereby being connected to the upper electrode 6 at a plurality of positions.

(4) The overhang portions 11 are not necessarily required. When variation of an electrical constant, which serve as an element characteristic, among elements and time-course variation of an electrical constant must be more reduced, in some cases, substantially the same size is imparted to the lower electrode 4 and the piezoelectric/electrostrictive film 5.

Also, there can be employed a structure which does not have the incomplete bond portions 7A by forming the lower electrode 4 greater than the piezoelectric/electrostrictive film 5. This eliminates need for accurate positioning between the lower electrode 4 and the piezoelectric/electrostrictive film 5. That is, this extends tolerance for misalignment between the lower electrode 4 and the piezoelectric/electrostrictive film 5.

(5) The through-holes 9 and the cavity portion 10 are also not limited in quantity, shape, arrangement, etc. to the configurations of the above embodiments and modifications.

For example, the cavity portion 10 may assume a simple cavity structure having no cover portion (a structure in which substantially the overall thin-walled portion 3 is exposed downward in FIG. 1(*ii*)). That is, the cavity portion 10 may be implemented by a single through-hole such that the shape of its opening as viewed from the bottom is substantially identical with the planar shape of the thin-walled diaphragm portion 3.

(6) The piezoelectric/electrostrictive film 5 may be formed to such a length that its end portion located on the side toward the auxiliary electrode 8 does not extend beyond a region corresponding to the thin-walled diaphragm portion 3. That is, the piezoelectric/electrostrictive film 5 may be formed in such a manner as to not overlie a region corresponding to the thick-walled portion 2.

(7) Those components which partially constitute means for solving the problems to be solved by the invention and are illustrated with respect to operations and functions encompass not only the specific structures disclosed above in the description of the above embodiments and modifications but also any other structures that can implement the operations and functions.

The invention claimed is:

1. A piezoelectric/electrostrictive film element in which a lower electrode and an auxiliary electrode, a piezoelectric/electrostrictive film, and an upper electrode are sequentially arranged in layers on a substrate formed from ceramics and having a thin-walled diaphragm portion and a thick-walled portion provided around the periphery of the thin-walled portion, wherein the lower electrode is continuously formed in a region ranging from a portion of the thick-walled portion located on one side of the thin-walled diaphragm portion to the thin-walled diaphragm portion;

the auxiliary electrode is continuously formed in a region ranging from a position on the thin-walled diaphragm portion, the position being separated from the lower electrode, to a portion of the thick-walled portion located on the other side of the thin-walled diaphragm portion;

the piezoelectric/electrostrictive film is formed in such a manner as to overlie the lower electrode and the auxiliary electrode; and the upper electrode is electrically connected to the auxiliary electrode through a plurality of mutually independent paths.

* * * * *